United States Patent
Hara

(10) Patent No.: US 11,587,969 B2
(45) Date of Patent: Feb. 21, 2023

(54) PHOTOELECTRIC CONVERSION APPARATUS AND EQUIPMENT

(71) Applicant: CANON KABUSHIKI KAISHA, Tokyo (JP)

(72) Inventor: Koji Hara, Ichikawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 280 days.

(21) Appl. No.: 16/905,611

(22) Filed: Jun. 18, 2020

(65) Prior Publication Data
US 2020/0411584 A1    Dec. 31, 2020

(30) Foreign Application Priority Data
Jun. 26, 2019    (JP) .............................. JP2019-119131

(51) Int. Cl.
H01L 27/146    (2006.01)

(52) U.S. Cl.
CPC .... *H01L 27/14643* (2013.01); *H01L 27/1461* (2013.01); *H01L 27/1463* (2013.01); *H01L 27/14605* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 2013/0207220 A1* | 8/2013 | Chang | H01L 31/103 438/57 |
| 2014/0347538 A1* | 11/2014 | Toda | H01L 27/14605 257/292 |
| 2016/0056200 A1* | 2/2016 | Lee | H01L 27/14641 257/292 |
| 2016/0211306 A1* | 7/2016 | Choi | H01L 27/1464 |
| 2017/0062500 A1* | 3/2017 | Kimura | H01L 27/14627 |
| 2018/0102389 A1* | 4/2018 | Lee | H01L 27/14625 |
| 2019/0027532 A1* | 1/2019 | Margutti | H01L 27/14645 |

FOREIGN PATENT DOCUMENTS

| | | |
|---|---|---|
| JP | 2008-153566 A | 7/2008 |
| JP | 2017-45873 A | 3/2017 |
| WO | 2017/188219 A1 | 11/2017 |
| WO | 2017/212977 A1 | 12/2017 |
| WO | 2019/008842 A1 | 1/2019 |

* cited by examiner

*Primary Examiner* — Ali Naraghi
(74) *Attorney, Agent, or Firm* — Canon U.S.A., Inc. IP Division

(57) ABSTRACT

A photoelectric conversion apparatus includes a plurality of pixels. Each of the plurality of pixels includes a first photoelectric conversion region and a second photoelectric conversion region. A first semiconductor region is disposed between the first photoelectric conversion region and the second photoelectric conversion region. The first photoelectric conversion region and the second photoelectric conversion region contain a first element mainly forming the first photoelectric conversion region and the second photoelectric conversion region, and the first photoelectric conversion region and the second photoelectric conversion region contain a second element. The first semiconductor region contains the first element and a third element. A mass number of the third element is twice or more a mass number of the first element.

20 Claims, 4 Drawing Sheets

PHOTOELECTRIC CONVERSION APPARATUS AND EQUIPMENT

BACKGROUND

Field

The present technique relates to a photoelectric conversion apparatus.

Description of the Related Art

For photoelectric conversion apparatuses, a structure for isolating carries into a plurality of photodiodes in a single pixel has been under study for ranging, focus detection, and expansion of a dynamic range. Japanese Patent Application Laid-Open No. 2017-45873 discusses that, in a pixel that corresponds to one micro lens and includes a plurality of photodiodes, an isolation region higher in impurity concentration than a well is formed for carrier isolation into the plurality of photodiodes.

Photoelectric conversion apparatuses have been required to achieve miniaturization of pixels and also realize multi-functionality at the same time. Japanese Patent Application Laid-Open No. 2017-45873 discusses that, in the pixel that corresponds to one micro lens and includes the plurality of photodiodes, the isolation region higher in impurity concentration than the well is formed for carrier isolation into the plurality of photodiodes. While such an isolation structure between the photodiodes on which light is optically collected is extremely important to achieve miniaturization of pixels, the structure may also serve as a cause for deterioration of pixel characteristics. Specific examples of the deterioration include a reduction in sensitivity/saturation, and a reduction in functionality/resolution due to a movement of a charge beyond an allowable value between the plurality of photodiodes. However, carrier isolation into the optically light-collecting photodiodes has not been sufficiently studied from the viewpoints of optics and miniaturization.

Under these circumstances, the present disclosure is directed to providing a technique advantageous in improving the performance of the photoelectric conversion apparatus.

SUMMARY

According to an aspect of the embodiments, a photoelectric conversion apparatus includes a plurality of pixels. Each of the plurality of pixels includes a first photoelectric conversion region and a second photoelectric conversion region. A first semiconductor region is disposed between the first photoelectric conversion region and the second photoelectric conversion region. The first photoelectric conversion region and the second photoelectric conversion region contain a first element mainly forming the first photoelectric conversion region and the second photoelectric conversion region, and the first photoelectric conversion region and the second photoelectric conversion region contain a second element. The first semiconductor region contains the first element and a third element. A mass number of the third element is twice or more a mass number of the first element.

Further features of the disclosure will become apparent from the following description of exemplary embodiments with reference to the attached drawings.

DESCRIPTION OF THE EMBODIMENTS

In the following description, a plurality of exemplary embodiments will be described. An element in each of the exemplary embodiments can be added to another exemplary embodiment or can be replaced with an element in another exemplary embodiment. Further, the disclosure shall not be limited to the exemplary embodiments that will be described below.

Figure 1:
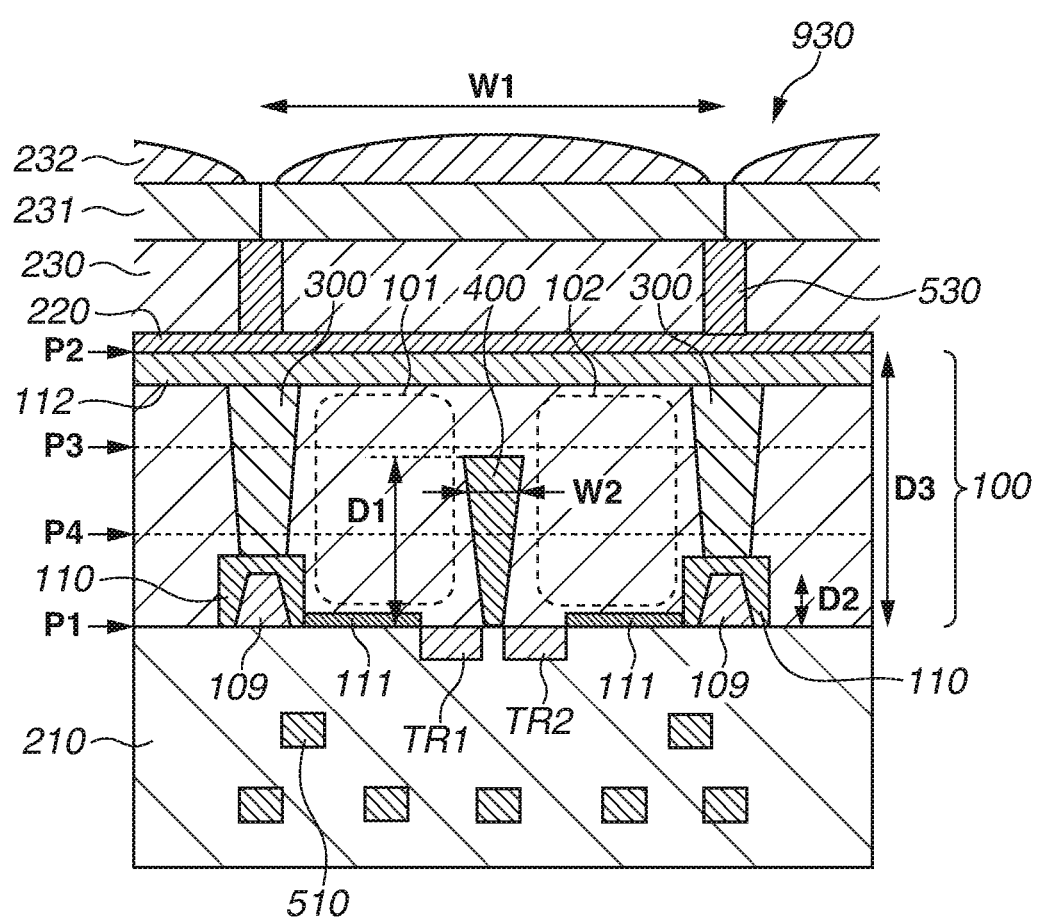
FIG. 1 is a schematic view illustrating a photoelectric conversion apparatus.

FIG. 1 is a cross-sectional schematic view illustrating a photoelectric conversion apparatus according to a first exemplary embodiment. A photoelectric conversion apparatus 930 is a complementary metal-oxide semiconductor (CMOS)-type image sensor, and a wiring layer, an optical element, and the like are omitted from the drawing of FIG. 1 illustrating a part of the image sensor.

The photoelectric conversion apparatus 930 includes at least a semiconductor layer 100. The semiconductor layer 100 is mainly made from, for example, silicon. In other words, a main constituent element α of the semiconductor layer 100 can be silicon. A main constituent element α in the semiconductor layer 100 is defined as an element which indicates the most (maximum) atomic concentration in the semiconductor layer 100. The amount of silicon may contribute more than 80% and less than 100% in the semiconductor layer 100. Other elements than the main constituent element α may be a dopant impurity element such as Boron, Phosphorus, Arsenic or Antimony or may be an inherent impurity element such as Oxygen or Hydrogen. The main constituent element α can be silicon, germanium, or diamond. The semiconductor layer 100 may be a compound semiconductor, such as gallium arsenide or gallium nitride. The compound semiconductor can contain a plurality of kinds of constituent elements, but the element having the largest mass number can be referred to as the main constituent element α.

The semiconductor layer 100 includes a first surface P1, and a second surface P2 opposite from the first surface P1. The second surface P2 is a surface on which light is incident. The first surface P1 is a front surface of the semiconductor layer 100, and the second surface P2 is a back surface of the semiconductor layer 100. The first exemplary embodiment is a so-called back-side illuminated photoelectric conversion apparatus. Transistors are disposed on the first surface P1. Each of the first surface P1 and the second surface P2 can also be referred to as an interface between silicon and other members. Each of the first surface P1 and the second surface P2 is a surface having a flat portion except for a groove of the semiconductor layer 100.

In FIG. 1, a photoelectric conversion region 101 and a photoelectric conversion region 102 are disposed in the semiconductor layer 100. In the following description, the photoelectric conversion regions 101 and 102 are negative (N)-type semiconductor regions. The photoelectric conversion regions 101 and 102 can include an N-type semiconductor region that conducts a photoelectric conversion and a negative plus (N+)-type semiconductor region that conducts a photoelectric conversion and also accumulates a charge generated from the photoelectric conversion (a charge accumulation region). The photoelectric conversion regions 101 and 102 contain an element serving as an N-type impurity element (an element β) in addition to the element α. A photodiode including the photoelectric conversion regions 101 and 102 can also include a not-illustrated positive (P)-type semiconductor region. The charge refers to a charge used as a signal, and an electron can be accumulated in the N-type semiconductor region. Each of the photoelectric conversion region 101 and the photoelectric conversion region 102, which is the N-type semiconductor region, forms a PN junction together with a P-type semiconductor region 112 disposed near the photoelectric conversion region 101 and the photoelectric conversion region 102, and functions as the photodiode (a photoelectric conversion element). When the semiconductor layer 100 is used as the photoelectric conversion apparatus 930, light is incident from the second surface P2, and the charge generated from the light can be accumulated in the charge accumulation region of the photoelectric conversion region 101 and the photoelectric conversion region 102.

On the first surface P1 of the semiconductor layer 100, a gate electrode TR1 of the transistor is disposed in correspondence with the photoelectric conversion region 101. Similarly, a gate electrode TR2 of the transistor is disposed in correspondence with the photoelectric conversion region 102 on the first surface P1 of the semiconductor layer 100. The gate electrode TR1 and the gate electrode TR2 are gate electrodes of a transfer transistor that transfers a charge. On the first surface P1 of the semiconductor layer 100, an insulating layer 210 and a conductive layer 510 are further disposed, and the charge is converted into a signal and read out when necessary.

On the second surface P2 the semiconductor layer 100, an insulator layer 220 for preventing light reflection, an insulator layer 230 serving as an optical path, a color filter array 231, and a micro lens array 232 are disposed. The micro lens array 232 includes a plurality of micro lenses. The color filter array 231 includes color filters for a plurality of colors. One pixel in the photoelectric conversion apparatus 930 includes at least the photoelectric conversion regions 101 and 102, and includes one micro lens in the micro lens array 232 and a color filter for one color in the color filter array 231. In other words, one micro lens and one color filter for one color are disposed above the two photoelectric conversion regions 101 and 102. While, in FIG. 1, one pixel includes the two photoelectric conversion regions 101 and 102, the number of the regions is not limited to two and may be three or more. At least one of the color filter array 231 and the micro lens array 232 can be omitted.

An element isolation portion 109 made of an insulator is disposed between the photoelectric conversion region 101 included in one of two pixels adjacent to each other among the plurality of pixels, and the photoelectric conversion region included in the other of the two pixels. The element isolation portion 109 having a shallow trench isolation (STI) structure and an inter-pixel isolation region 300 are disposed between the pixels, in this order from the first surface P1 in the semiconductor layer 100, and a conductor layer 530 is disposed between the pixels in the insulator layer 230 over the second surface P2. The inter-pixel isolation region 300 is disposed in the semiconductor layer 100 and is, for example, a P-type semiconductor region, and prevents charge generated by light from diffusing to adjacent pixels. The inter-pixel isolation region 300 contains the main constituent element α of the semiconductor layer 100 and a P-type impurity element δ. The semiconductor region of the inter-pixel isolation region 300 can overlap the element isolation portion 109. A P-type semiconductor region 110 is disposed to cover the element isolation portion 109 and a P-type semiconductor region 111 is disposed to cover the interface of the semiconductor layer 100 on the first surface P1. Both the semiconductor region 110 and the semiconductor region 111 can serve as a pinning layer preventing a dark current due to an interface state. The conductor layer 530 is disposed in the insulator layer 230 stacked over the second surface P2 of the semiconductor layer 100 and is, for example, tungsten, and prevents light from being transmitted to adjacent pixels. Further, a P-type semiconductor region 112 is disposed to cover the interface of the semiconductor layer 100 on the second surface P2, and can serve as a pinning layer preventing a dark current due to the interface state. The semiconductor region 112 can overlap the element isolation portion 109.

Between the photoelectric conversion region 101 and the photoelectric conversion region 102 of the semiconductor layer 100, an intra-pixel isolation region 400 is disposed. The intra-pixel isolation region 400 is a semiconductor region containing the main constituent element α of the semiconductor layer 100. The intra-pixel isolation region 400 is disposed from the first surface P1 to a third surface P3 of the semiconductor layer 100 and is, for example, a P-type semiconductor region, and prevents a charge generated by light from excessively diffusing to an adjacent photoelectric conversion region. The impurity element in the intra-pixel isolation region 400 includes at least an impurity element γ having a mass number twice or more the mass number of the main constituent element α of the semiconductor layer 100. The mass number of the impurity element δ in the inter-pixel isolation region 300 may be smaller than the mass number of the impurity element γ in the intra-pixel isolation region 400. The semiconductor region of the intra-pixel isolation region 400 can contain only the element γ out of the element γ and the element δ.

For example, the main constituent element α of the semiconductor layer 100 is silicon having a mass number of 28 to 30, and the P-type impurity element in the intra-pixel isolation region 400 includes indium having a mass number of 113 or 115, gallium having a mass number of 69 or 71, or the like as the impurity element γ. Alternatively, in a case where the signal is produced by using a hole as the photoelectrically converted charge, the photoelectric conversion region 101 and the photoelectric conversion region 102 are P-type semiconductor regions. The intra-pixel isolation region 400 is an N-type semiconductor region, and the N-type impurity element in the intra-pixel isolation region 400 includes an element such as arsenic having a mass number of 75 and antimony having a mass number of 121 or 123. The impurity concentrations of the photoelectric conversion region 101 and the photoelectric conversion region 102, and the intra-pixel isolation region 400 are, for example, approximately $1 \times 10^{15}$ to $1 \times 10^{20}$ atoms/cm$^3$, and, desirably, $1 \times 10^{16}$ to $1 \times 10^{19}$ atoms/cm$^3$.

A distance D1 is the distance from the first surface P1 to an end portion of the intra-pixel isolation region 400 on the second surface P2 side. In other words, the distance D1 is the depth of the intra-pixel isolation region 400 from the first surface P1. Desirably, the distance D1 is longer than a distance D2 (D1>D2). The distance D2 is the depth of the element isolation portion 109 from the first surface P1. A fourth surface P4 is a flat surface located away from the first surface P1 by 1 μm. A third surface P3 is a flat surface located away from the first surface P1 by 2 μm. The impurity element γ contained in the intra-pixel isolation region 400 is included between the fourth surface P4 and the first surface P1. The impurity element γ contained in the intra-pixel isolation region 400 is also included between the fourth surface P4 and the second surface P2. The impurity element γ contained in the intra-pixel isolation region 400 is included between the fourth surface P4 and the third surface P3. Since the distance D1 is shorter than 2 µm in the present exemplary embodiment, the impurity element γ contained in the intra-pixel isolation region 400 is absent between the third surface P3 and the second surface P2.

Advantageous effects of the present exemplary embodiment will be described. Even if the mass number of the impurity element γ in the intra-pixel isolation region 400 is smaller than twice the mass number of the main constituent element α of the semiconductor layer 100, the photoelectric conversion regions 101 and 102 would be able to be isolated from each other. However, when the miniaturization of the pixel is attempted, it would be difficult to narrow the width of the pixel while keeping the depth of the distance D1. For example, among a plurality of the pixels including a first pixel, a second pixel, and a third pixel, the second pixel is disposed between the first pixel and the third pixel, and the first pixel and the third pixel are located away from each other by a distance corresponding to a width W1 of the second pixel. Desirably, the width W1 of the second pixel is 4 µm or shorter. If the width W1 of the pixel is 4 µm, it is desirable that a width W2 of the intra-pixel isolation region 400 is 0.8 µm or narrower to secure the saturation charge numbers of the photoelectric conversion regions 101 and 102 and isolate charges generated in the photoelectric conversion region 101 and the photoelectric conversion region 102, to acquire the functionality. Meanwhile, since the distance D1 depends on the depths of the photoelectric conversion regions 101 and 102, the distance D1 cannot be reduced according to miniaturization of the pixel. Therefore, an aspect ratio of the intra-pixel isolation region 400 to the pixel increases according to miniaturization of the pixel. Since the intra-pixel isolation region 400 is formed by an ion implantation method from the first surface P1 of the semiconductor layer 100, an aspect ratio of an aperture of a resist is increased according to the aspect ratio of the intra-pixel isolation region 400. Further, the ion implantation method is characterized in that the width W2 in the horizontal direction increases as the distance D1 increases. Therefore, when the predetermined aspect ratio of the aperture of the resist increases, the width W2 at the distance D1 also undesirably exhibits a certain distribution spreading in the horizontal direction. Now, the width W2 depends on, for example, the mass of the implanted impurity element, and the mass, the implantation angle with respect to the crystal orientation, and the temperature of the main constituent element α of the semiconductor layer 100, which is the implantation target. Therefore, by using the element having the mass number twice or more the mass number of the main constituent element α of the semiconductor layer 100 as the impurity element in the intra-pixel isolation region 400, according to the present exemplary embodiment, the width W2 can be formed narrow at the distance D1. With this configuration, a photoelectric conversion apparatus having a miniaturized isolation structure while maintaining the isolation performance can be acquired.

Even in a case that the intra-pixel isolation region 400 contains an impurity element having a mass number smaller than twice the mass number of the main constituent element α of the semiconductor layer 100, the width W2 would be able to be narrowed using the ion implantation method from the second surface P2 of the semiconductor layer 100. However, in such a case, a local heating method such as the laser annealing method, which does not thermally affect the conductive layer 510, is employed as a thermal treatment for recovering crystallinity impaired due to the ion implantation method. Further, since the intra-pixel isolation region 400 has the depth sufficient to isolate a charge generated by the incident light, the local thermal treatment method raises a concern of an increase in the dark current due to insufficiency of recovery in the crystallinity as the distance from the second surface P2 increases toward the first surface P1. Therefore, it is useful to provide the element having the mass number twice or more the mass number of the main constituent element α of the semiconductor layer 100 as the impurity element in the intra-pixel isolation region 400, like the present exemplary embodiment. With the above-described configuration, the crystallinity can be sufficiently recovered while thermal diffusion of the impurity element is reduced or prevented, and therefore a photoelectric conversion apparatus having a miniaturized element isolation structure can be acquired while increase in the dark current is reduced or prevented and the isolation performance is maintained.

A distance D3 between the first surface P1 and the second surface P2, which corresponds to the thickness of the semiconductor layer 100, is determined according to a wavelength of light to be detected. For example, in a case of a photoelectric conversion apparatus designed for visible light, the distance D3 is 5 µm or shorter, and, desirably, approximately 2 to 4 µm. The distance D1 can be set within a range of the distance D3 or shorter (D1≤D3), and setting the distance D1=D3 allows the intra-pixel isolation region 400 to efficiently isolate a charge generated by light incident from the second surface P2. Especially, providing the impurity element having the mass number twice or more the mass number of the main constituent element α of the semiconductor layer 100 at a depth of approximately 1 µm or shallower from the second surface P2 in the intra-pixel isolation region 400 is desirable. With the above-described configuration, spread of the width W2 to form the narrow intra-pixel isolation region 400 having a high impurity concentration can be reduced, and therefore a sufficient isolation performance can be acquired even with miniaturized pixels.

Meanwhile, in the intra-pixel isolation region 400, providing the impurity element having the mass number twice or more the mass number of the main constituent element α of the semiconductor layer 100 within a range of a depth of approximately 1 µm or shallower from the first surface P1 is desirable. With the above-described configuration, the intra-pixel isolation region 400 having a steep impurity concentration gradient can be formed to prevent spread of a depletion layer between the photoelectric conversion regions 101 and 102, and therefore a photoelectric conversion apparatus satisfying the sufficient saturation charge number even with miniaturized pixels can be acquired.

It is further desirable that the intra-pixel isolation region 400 contains the impurity element having the mass number twice or more the mass number of the main constituent element α of the semiconductor layer 100 by $1 \times 10^{13}$ atoms/$cm^2$ or more per unit area. With the above-described configuration, the semiconductor layer 100 can be expected to be recrystallized after becoming amorphous first while the isolation performance is enhanced, and therefore the highly crystalline intra-pixel isolation region 400 can be formed and a photoelectric conversion apparatus capable of further reducing the dark current can be acquired.

It is yet further desirable that, the ratio of the impurity element having the mass number twice or more the mass number of the main constituent element α of the semiconductor layer 100 to the total concentration of elements in the same group in the intra-pixel isolation region 400 is secured at 50% or higher. With the above-described configuration, a photoelectric conversion apparatus having a miniaturized element isolation structure can be acquired while the isolation performance is further enhanced.

It is yet further desirable that the intra-pixel isolation region 400 contains homologous impurities belonging to a same group as the impurity element γ (the element γ having the mass number twice or more the mass number of the main constituent element α of the semiconductor layer 100) at a maximum total concentration of $1 \times 10^{18}$ atoms/cm$^3$ or higher. With the above-described configuration, a photoelectric conversion apparatus having a miniaturized element isolation structure can be acquired while the isolation performance is further enhanced.

Figure 2:
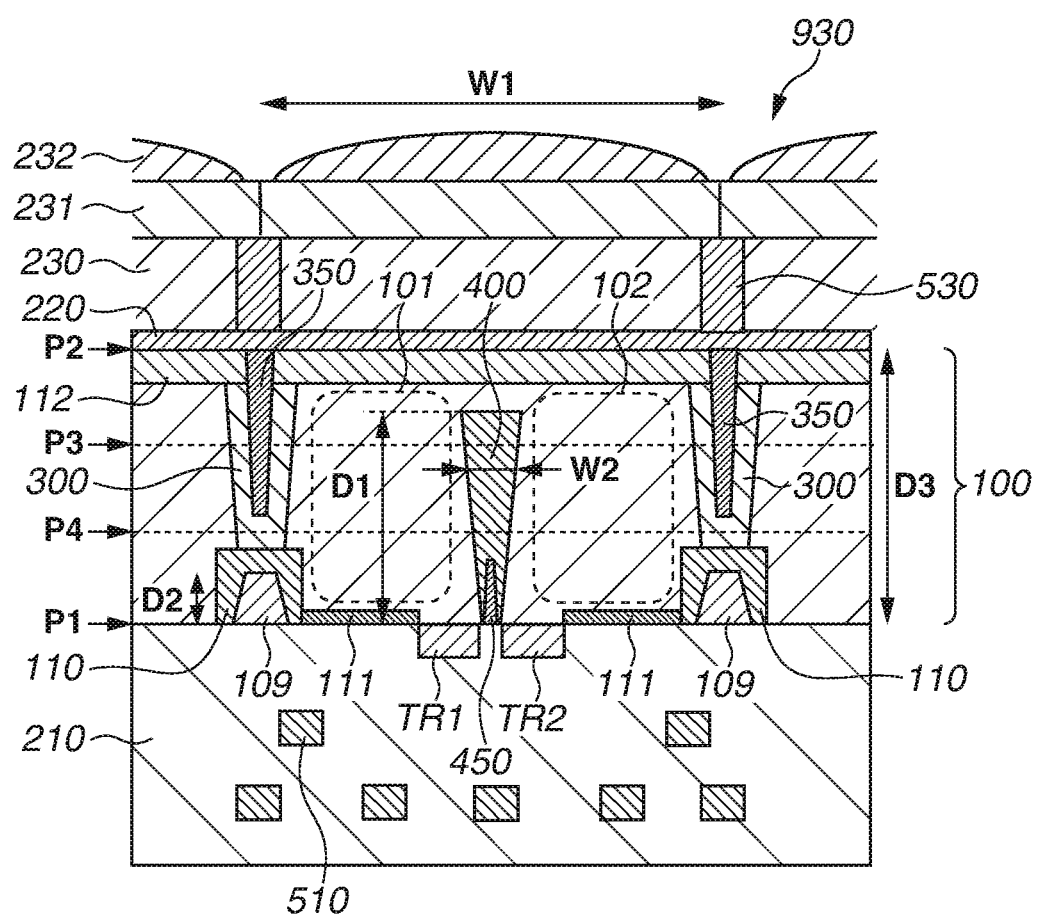
FIG. 2 is a schematic view illustrating a photoelectric conversion apparatus.

A second exemplary embodiment will be described with reference to FIG. 2. The second exemplary embodiment will be described, omitting features that may be similar to the features of the first exemplary embodiment.

In the inter-pixel isolation region 300, it is desirable that an inter-pixel isolation portion 350 is disposed for preventing the light transmission between the pixels from the second surface P2 of the semiconductor layer 100. The inter-pixel isolation portion 350 may be formed by at least one of an insulator region and a conductor region. In other words, at least one of the insulator region and the conductor region may be disposed between the photoelectric conversion region 101 included in one of the two pixels adjacent to each other among the plurality of pixels, and the photoelectric conversion region included in the other of the two pixels. By the inter-pixel isolation portion 350 reduction in resolution between the pixels due to obliquely incident light and a color mixture between the pixels for different colors can be reduced or prevented. The inter-pixel isolation portion 350 is formed by an impurity region similar to the intra-pixel isolation region 400, and prevents an overflowing charge from diffusing to adjacent pixels when excessive amount of light is incident on the photoelectric conversion region 101 and saturation is induced. Then, the inter-pixel isolation portion 350 can ensure that the charge leaks to the adjacent photoelectric conversion region 102 in the same pixel. Accordingly, a photoelectric conversion apparatus in which a knee characteristic is improved, blooming is prevented, and the dynamic range is expanded.

In the present exemplary embodiment, the impurity element γ contained in the intra-pixel isolation region 400 is also included between the third surface P3 and the second surface P2. It is desirable that an intra-pixel isolation portion 450 having a depth shallower than 2 μm from the first surface P1 of the semiconductor layer 100 is disposed in the intra-pixel isolation region 400. The depth of the intra-pixel isolation portion 450 may be equal to the depth of the element isolation portion 109. The intra-pixel isolation portion 450 may be formed by at least one of an insulator region and a conductor region. In other words, at least one of the insulator region and the conductor region may be disposed between the photoelectric conversion region 101 and the photoelectric conversion region 102.

The inter-pixel isolation portion 350 and the intra-pixel isolation portion 450 can be formed by forming a groove on the semiconductor layer 100 and embedding an insulator, such as a silicon compound and a metal compound (for example, metallic oxide) or a conductor, such as metal and polysilicon in the groove.

The intra-pixel isolation region 400 can be disposed by forming the groove for forming the intra-pixel isolation portion 450 on the first surface P1 of the semiconductor layer 100, and, after that, implanting the impurity element having the mass number twice or more the mass number of the main constituent element α of the semiconductor layer 100 using the ion implantation method via the groove. Employing this method further facilitates increasing the distance D1 even when the impurity element having the large mass number is provided, and, further, contributes to reducing an implantation range in the semiconductor layer 100 targeted for the implantation, and therefore, scattering can be reduced or prevented. Accordingly, the width W2 at the distance D1 can be further narrowed, and therefore a photoelectric conversion apparatus having a miniaturized element isolation structure can be acquired while the isolation performance is further enhanced.

Figure 3:
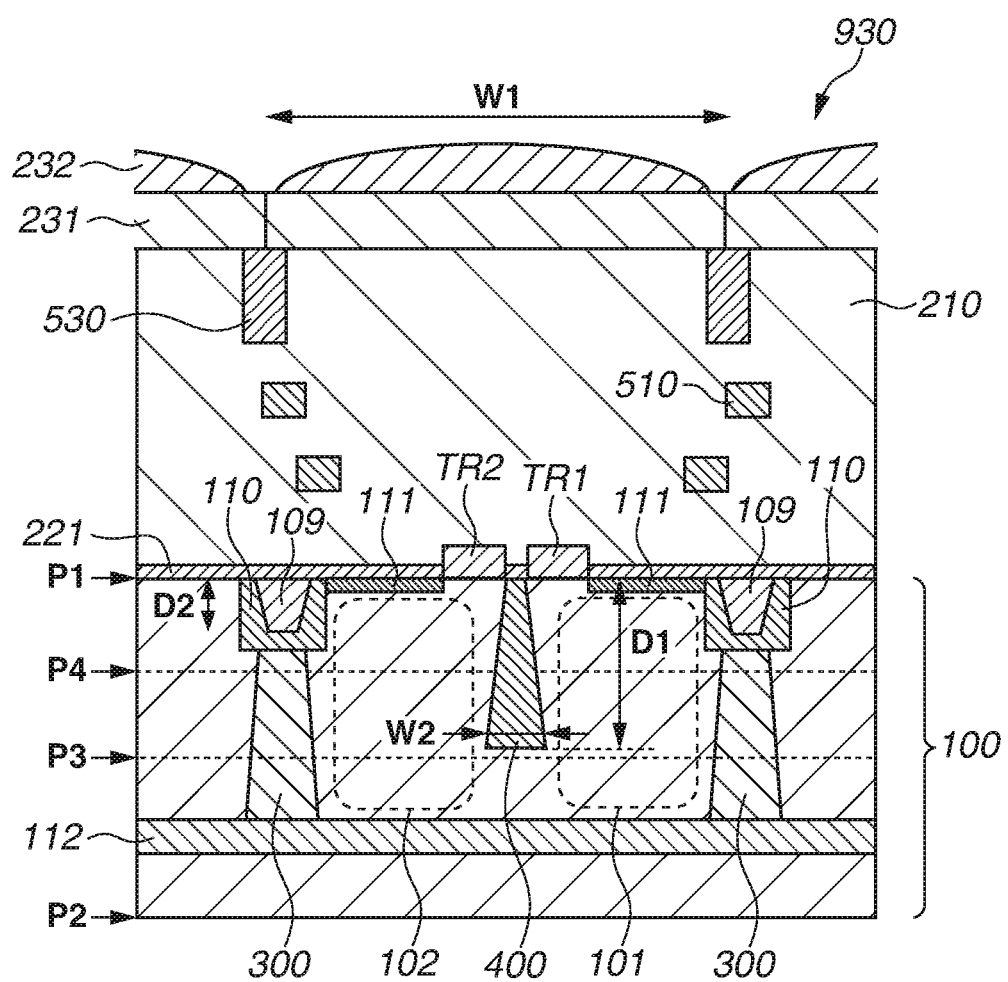
FIG. 3 is a schematic view illustrating a photoelectric conversion apparatus.

A third exemplary embodiment will be described with reference to FIG. 3. The photoelectric conversion apparatus 930 will be described. FIG. 3 is a cross-sectional schematic view of the photoelectric conversion apparatus 930, and the third exemplary embodiment will be described omitting features that may be similar to the first exemplary embodiment.

The photoelectric conversion apparatus 930 includes at least the semiconductor layer 100. The semiconductor layer 100 is made from, for example, silicon. The semiconductor layer 100 includes the first surface P1. In FIG. 3, the semiconductor layer 100 is, for example, an N-type semiconductor region, and the photoelectric conversion region 101 and the photoelectric conversion region 102 are disposed in the semiconductor layer 100. The photoelectric conversion region 101 and the photoelectric conversion region 102 are N-type semiconductor regions, and can accumulate a generated charge. The charge here refers to a charge used as a signal. At least the semiconductor region 101 and the photoelectric conversion region 102 of the semiconductor layer 100 each form a PN junction with another P-type semiconductor region, and function as a photoelectric conversion region. As will be used herein, in the following description, the semiconductor region 101 and the photoelectric conversion region 102 correspond to the photoelectric conversion region 101 and the photoelectric conversion region 102, respectively. When the semiconductor layer 100 is used as the photoelectric conversion apparatus 930, light is incident from the first surface P1, and a charge generated from the light can be accumulated in the photoelectric conversion region 101 and the photoelectric conversion region 102. The third exemplary embodiment is a so-called front-side illuminated photoelectric conversion apparatus.

On the first surface P1 of the semiconductor layer 100, the gate electrode TR1 is disposed in correspondence with the photoelectric conversion region 101. Similarly, the gate electrode TR2 is disposed in correspondence with the photoelectric conversion region 102 on the first surface P1 of the semiconductor layer 100. On the first surface P1 side of the semiconductor layer 100, the insulating layer 210 and the conductive layer 510 are disposed, and an insulator layer 221 preventing light reflection and forming an optical path, the color filter array 231, and the micro lens array 232 are also disposed.

Between the pixels in the semiconductor layer 100, the element isolation portion 109 and the inter-pixel isolation region 300 are disposed, and between the pixels in the insulating layer 210, the conductor layer 530 is disposed.

The inter-pixel isolation region 300 is disposed in the semiconductor layer 100 and is, for example, a P-type semiconductor region, and prevents a charge generated by light from diffusing to adjacent pixels. The semiconductor region 110 is disposed to cover the element isolation portion 109 and the semiconductor region 111 is disposed to cover the interface of the semiconductor layer 100 on the first surface P1, respectively, and both are, for example, P-type semiconductor regions and can serve as a pinning layer preventing a dark current due to an interface state.

The intra-pixel isolation region 400 is further disposed between the photoelectric conversion region 101 and the photoelectric conversion region 102 of the semiconductor layer 100.

The intra-pixel isolation region 400 is disposed from the first surface P1 to the third surface P3 of the semiconductor layer 100 and is, for example, a P-type semiconductor region, and prevents a charge generated by light from excessively diffusing to an adjacent photoelectric conversion region. The impurity element includes an impurity element having a mass number twice or more the mass number of the main constituent element α of the semiconductor layer 100 as at least one kind of impurity element therein. For example, the main constituent element α of the semiconductor layer 100 is silicon having the mass number of 28 to 30, and the P-type impurity element in the intra-pixel isolation region 400 is indium having the mass number of 113 or 115 or gallium having the mass number of 69 or 71. The N-type impurity element in intra-pixel isolation region 400 includes an element such as arsenic having the mass number of 75 and antimony having the mass number of 121 or 123.

Advantageous effects of the present exemplary embodiment will be described. Even in a case that the intra-pixel isolation region 400 contains an impurity element having a mass number smaller than twice the mass number of the main constituent element α of the semiconductor layer 100, the photoelectric conversion regions 101 and 102 would be able to be isolated from each other. However, when miniaturization of the pixel is attempted, it would be difficult to narrow the width of the intra-pixel isolation region 400 while the depth of the distance D1 is remained. If the width W1 of the pixel is 4 μm, it is desirable that the width W2 of the intra-pixel isolation region 400 is 1 μm or narrower to secure the saturation charge numbers of the photoelectric conversion regions 101 and 102. Meanwhile, since the distance D1 depends on the depths of the photoelectric conversion regions 101 and 102, the distance D1 cannot be reduced according to the miniaturization of the pixel. More specifically, the semiconductor layer 100 should satisfy the distances D1>D2. Therefore, an aspect ratio of the intra-pixel isolation region 400 to the pixel increases according to miniaturization of the pixel. Since the intra-pixel isolation region 400 is formed by the ion implantation method from the first surface P1 of the semiconductor layer 100, an aspect ratio of an aperture of a resist is increased according to the aspect ratio of the intra-pixel isolation region 400. Further, the ion implantation method is characterized in that the width W2 in the horizontal direction increases as the distance D1 increases. Therefore, when the predetermined aspect ratio of the aperture of the resist increases, the width W2 at the distance D1 is also subjected to a restriction. This restriction depends on, for example, the mass of the implanted impurity element, and the mass, the implantation angle with respect to the crystal orientation, and a temperature of the semiconductor element which is the implantation target. Therefore, according to the present exemplary embodiment, by providing the element having the mass number twice or more the mass number of the main constituent element α of the semiconductor layer 100 as the impurity element in the intra-pixel isolation region 400, the width W2 at the distance D1 can be narrowed. With the above-described configuration, a photoelectric conversion apparatus having a miniaturized element isolation structure can be acquired while the isolation performance is maintained.

It is desirable that the impurity element having the mass number twice or more the mass number of the main constituent element α of the semiconductor layer 100 is disposed at a depth of 1 μm or deeper from the first surface P1 in the intra-pixel isolation region 400. With the above-described configuration, spread of the width W2 can be reduced to form the intra-pixel isolation region 400 which is in a narrow shape and has a high impurity concentration, and a charge generated in a deep region away from the first surface P1 can be isolated. Therefore a sufficient isolation performance can be acquired even with miniaturized pixels. Further, the impurity element having the mass number smaller than twice the mass number of the main constituent element α of the semiconductor layer 100 is provided at a depth of the distance D2 or shallower in the intra-pixel isolation region 400. With the above-described configuration, the intra-pixel isolation region 400 having a steep impurity concentration gradient can be formed, and therefore a photoelectric conversion apparatus satisfying the sufficient saturation charge number can be acquired even with miniaturized pixels. For example, the main constituent element α of the semiconductor layer 100 is silicon having the mass number of 28 to 30, and the P-type impurity element δ in the inter-pixel isolation region 300 includes boron having a mass number of 10 or 11 or the N-type impurity element δ therein includes phosphorus having a mass number of 31.

Further, it is desirable that the inter-pixel isolation region 300 contains an impurity element having a mass number smaller than twice the mass number of the main constituent element α of the semiconductor layer 100. For example, the main constituent element α of the semiconductor layer 100 is silicon having the mass number of 28 to 30, and the P-type impurity element in the inter-pixel isolation region 300 includes boron having the mass number of 10 or 11 or the N-type impurity element therein includes phosphorus having the mass number of 31. It is further desirable that the inter-pixel isolation region 300 does not contain an impurity element having a mass number twice or more the mass number of the main constituent element α of the semiconductor layer 100. For example, the main constituent element α of the semiconductor layer 100 is silicon having the mass number of 28 to 30, and the P-type impurity element in the inter-pixel isolation region 300 includes boron having the mass number of 10 or 11. Alternatively, the N-type impurity element in the inter-pixel isolation region 300 includes phosphorus having the mass number of 31. The inter-pixel isolation region 300 does not have to contain indium having the mass number of 113 or 115 and gallium having the mass number of 69 or 71, or an element such as arsenic having the mass number of 75 and antimony having the mass number of 121 or 123 as the N-type impurity element. The impurity concentration of the inter-pixel isolation region 300 is, for example, approximately $1 \times 10^{15}$ to $1 \times 10^{20}$ atoms/cm$^3$, and, desirably, $1 \times 10^{16}$ to $1 \times 10^{19}$ atoms/cm$^3$. It is yet further desirable that the impurity concentration of the intra-pixel isolation region 400 is $1 \times 10^{15}$ to $1 \times 10^{18}$ atoms/cm$^3$, and is desirably lower than the impurity concentration of the inter-pixel isolation region 300. Even in a case that the inter-pixel isolation region 300 contains an impurity element having a mass number twice or more the mass number of the main constituent element α of the semiconductor layer 100, it would be able to acquire a photoelectric conversion apparatus having a miniaturized element isolation structure. The photoelectric conversion apparatus is required to prevent an overflowing charge from diffusing to adjacent pixels and ensure that the overflowing charge leaks to the adjacent photoelectric conversion region 102 in the same pixel, when an excessive amount of light is incident on the photoelectric conversion region 101 and saturation is induced. In other words, the inter-pixel isolation region 300 achieving an isolation performance equivalent to or higher than the intra-pixel isolation region 400 is required. Meanwhile, since the ion implantation method easily results in a steep impurity concentration gradient for an impurity element having a large mass number, a portion where the impurity concentration reduces may serve as a path for a charge to diffuse in a case where the impurity region is formed by implanting the ions a plurality of times corresponding to a plurality of depths. Therefore, the inter-pixel isolation region 300 can reduce the path for a charge to diffuse without increasing the number of times of the ion implantation by using the impurity element having the mass number smaller than twice the mass number of the main constituent element α of the semiconductor layer 100. Further, the inter-pixel isolation region 300 prevents an overflowing charge from diffusing to adjacent pixels when an excessive amount of light is incident on the photoelectric conversion region 101 and the saturation is induced. Furthermore, the inter-pixel isolation region 300 can ensure that a charge leaks to the adjacent photoelectric conversion region 102 in the same pixel, and therefore a photoelectric conversion apparatus in which a knee characteristic is improved, blooming is prevented, and the dynamic range is expanded can be acquired.

Figure 4:
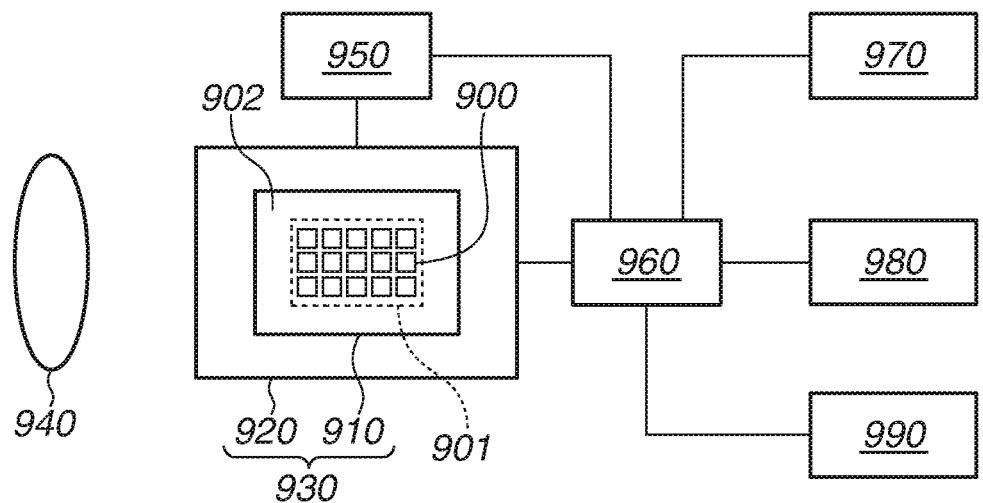
FIG. 4 is a schematic view illustrating equipment including the photoelectric conversion apparatus.

In the following description, equipment 9191 including the photoelectric conversion apparatus 930 according to a fourth exemplary embodiment will be described with reference to FIG. 4. In addition to a semiconductor device 910 including the semiconductor layer 100 as described above, the photoelectric conversion apparatus 930 can include a package 920 that houses the semiconductor device 910. The package 920 can include a substrate on which the semiconductor device 910 is fixed, and a cover member such as glass facing the semiconductor device 910. The package 920 can further include a joint member such as a bonding wire and a bump connecting a terminal disposed on the substrate and a terminal disposed on the semiconductor device 910.

The equipment 9191 can include at least any of an optical apparatus 940, a control apparatus 950, a processing apparatus 960, a display apparatus 970, a storage apparatus 980, and a mechanical apparatus 990. The optical apparatus 940 corresponds to the photoelectric conversion apparatus 930. The optical apparatus 940 is, for example, a lens, a shutter, or a mirror. The control apparatus 950 controls the photoelectric conversion apparatus 930. The control apparatus 950 is, for example, a photoelectric conversion apparatus such as an application specific integrated circuit (ASIC).

The processing apparatus 960 processes a signal output from the photoelectric conversion apparatus 930. The processing apparatus 960 is, for example, a central processing unit (CPU) and an ASIC for constructing an analog front end (AFE) or a digital front end (DFE) for a photoelectric conversion apparatus. The display apparatus 970 is, for example, an electro-luminescence (EL) display apparatus or a liquid crystal display apparatus that displays information (an image) acquired by the photoelectric conversion apparatus 930. The storage apparatus 980 is a magnetic device or a semiconductor device that stores therein the information (the image) acquired by the photoelectric conversion apparatus 930. The storage apparatus 980 is a volatile memory such as a static random access memory (SRAM) and a dynamic RAM (DRAM), or a nonvolatile memory such as a flash memory and a hard disk drive.

The mechanical apparatus 990 includes a movable unit or a thrust unit such as a motor and an engine. The equipment 9191 displays the signal output from the photoelectric conversion apparatus 930 on the display apparatus 970 or transmits the signal to outside using a communication apparatus (not illustrated) included in the equipment 9191. For achieving the function, it is desirable that the equipment 9191 further includes the storage apparatus 980 and the processing apparatus 960 in addition to a storage circuit and a calculation circuit included in the photoelectric conversion apparatus 930. The mechanical apparatus 990 may be controlled based on the signal output from the photoelectric conversion apparatus 930.

The equipment 9191 is suitable to electronic equipment such as an information terminal having the imaging function (for example, a smart-phone and a wearable terminal) and a camera (for example, an interchangeable-lens camera, a compact camera, a video camera, and a monitoring camera). The mechanical apparatus 990 in the camera can drive a component of the optical apparatus 940 for zooming, focusing, and a shutter operation. Alternatively, the mechanical apparatus 990 in the camera can move the photoelectric conversion apparatus 930 for a vibration damping operation.

The equipment 9191 can be a transportation, such as a vehicle, a ship, and a flight vehicle. The mechanical apparatus 990 in the transportation can be used as a movement apparatus. The equipment 9191 as the transportation is effectively applicable to equipment that transports the photoelectric conversion apparatus 930, and equipment that assists and/or automates driving (manipulation) using the imaging function. The processing apparatus 960 for assisting and/or automating driving (manipulation) can perform processing for manipulating the mechanical apparatus 990 functioning as the movement apparatus based on the information acquired by the photoelectric conversion apparatus 930. Alternatively, the equipment 9191 may be a medical equipment such as an endoscope, a measurement instrument such as a ranging sensor, an analytical instrument such as an electronic microscope, or office equipment such as a copying machine.

According to the present exemplary embodiment, the isolation structure between the photoelectric conversion regions can be improved. Therefore, pixel characteristics of the photoelectric conversion apparatus can be improved.

By using the photoelectric conversion apparatus according to the present exemplary embodiment, the performance of the photoelectric conversion apparatus can be enhanced. Consequently, for example, excellent reliability can be acquired when the photoelectric conversion apparatus is mounted on a transportation and captures an image outside the transportation or measures an external environment. Therefore, enhancing the performance of a transportation by mounting the photoelectric conversion apparatus according to the present exemplary embodiment onto the transportation when manufacturing or selling the transportation can be advantageous.

According to the present disclosure, an advantageous technique in improving the performance of the photoelectric conversion apparatus can be provided.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-119131, filed Jun. 26, 2019, which is hereby incorporated by reference herein in its entirety.

What is claimed is:

1. A photoelectric conversion apparatus comprising:
a plurality of pixels,
wherein each of the plurality of pixels includes a first photoelectric conversion region and a second photoelectric conversion region,
wherein a first semiconductor region is disposed between the first photoelectric conversion region and the second photoelectric conversion region,
wherein the first photoelectric conversion region and the second photoelectric conversion region contain a first element mainly forming the first photoelectric conversion region and the second photoelectric conversion region, and the first photoelectric conversion region and the second photoelectric conversion region contain a second element,
wherein the first semiconductor region contains the first element and a third element, and
wherein a mass number of the third element is twice or more a mass number of the first element.

2. The photoelectric conversion apparatus according to claim 1,
wherein a second semiconductor region is disposed between a photoelectric conversion region included in one of two pixels adjacent to each other among the plurality of pixels, and another photoelectric conversion region included in the other of the two pixels,
wherein the second semiconductor region contains the first element and a fourth element, and
wherein a mass number of the fourth element is smaller than a mass number of the second element.

3. The photoelectric conversion apparatus according to claim 2, wherein the first semiconductor region contains only the third element out of the third element and the fourth element.

4. The photoelectric conversion apparatus according to claim 2, wherein an element isolation portion including an insulator is disposed between the photoelectric conversion region included in the one of the two pixels adjacent to each other among the plurality of pixels and the another photoelectric conversion region included in the other of the two pixels, and the second semiconductor region overlaps the element isolation portion.

5. The photoelectric conversion apparatus according to claim 2, wherein the third element is indium, and the fourth element is boron.

6. The photoelectric conversion apparatus according to claim 1, wherein at least one of an insulator region and a conductor region is disposed between a photoelectric conversion region included in the one of the two pixels adjacent to each other among the plurality of pixels and another photoelectric conversion region included in the other of the two pixels.

7. The photoelectric conversion apparatus according to claim 1, wherein at least one of an insulator region and a conductor region is disposed between the first photoelectric conversion region and the second photoelectric conversion region.

8. The photoelectric conversion apparatus according to claim 1,
wherein the first photoelectric conversion region, the second photoelectric conversion region, and the first semiconductor region are disposed in a semiconductor region mainly including the first element,
wherein the semiconductor region includes a front surface on which a transistor is disposed, and a back surface opposite from the front surface, and
wherein the third element is included between a flat surface away from the front surface by 1 µm and the front surface.

9. The photoelectric conversion apparatus according to claim 1,
wherein the first photoelectric conversion region, the second photoelectric conversion region, and the first semiconductor region are disposed in a semiconductor region mainly including the first element,
wherein the semiconductor region includes a front surface on which a transistor is disposed, and a back surface opposite from the front surface, and
wherein the third element is included between a flat surface away from the front surface by 1 µm and the back surface.

10. The photoelectric conversion apparatus according to claim 1,
wherein the first photoelectric conversion region, the second photoelectric conversion region, and the first semiconductor region are disposed in a semiconductor region mainly including the first element,
wherein the semiconductor region includes a front surface on which a transistor is disposed, and a back surface opposite from the front surface, and
wherein the third element is included between a flat surface away from the front surface by 2 µm and the back surface.

11. The photoelectric conversion apparatus according to claim 1, wherein a concentration of the third element in the first semiconductor region is $1 \times 10^{15}$ to $1 \times 10^{20}$ atoms/cm$^3$.

12. The photoelectric conversion apparatus according to claim 1, wherein a ratio of the third element to elements in a same group as the third element is 50% or higher in the first semiconductor region.

13. The photoelectric conversion apparatus according to claim 1, wherein a concentration of elements in a same group as the third element is $1 \times 10^{18}$ atoms/cm$^3$ or higher in the first semiconductor region.

14. The photoelectric conversion apparatus according to claim 1, wherein the second element is phosphorus or arsenic, and the third element is indium.

15. The photoelectric conversion apparatus according to claim 1, wherein the second element is boron, and the third element is arsenic or antimony.

16. The photoelectric conversion apparatus according to claim 1, wherein the first element is silicon.

17. The photoelectric conversion apparatus according to claim 1, wherein the plurality of pixels includes a first pixel, a second pixel, and a third pixel, the second pixel being disposed between the first pixel and the third pixel, the first pixel and the third pixel being away from each other by a distance of 4 µm or shorter.

18. The photoelectric conversion apparatus according to claim 1, wherein a lens array including a plurality of micro lenses is disposed on a light incident surface of a semiconductor region, and one micro lens among the plurality of micro lenses is disposed above the first photoelectric conversion region and the second photoelectric conversion region included in one pixel.

19. The photoelectric conversion apparatus according to claim 1, wherein a color filter array including color filters for a plurality of colors is disposed on a light incident surface of a semiconductor region, and a color filter for one color among the color filters for the plurality of colors is disposed above the first photoelectric conversion region and the second photoelectric conversion region included in one pixel.

20. Equipment comprising:
the photoelectric conversion apparatus according to claim 1; and
at least any one of the following six apparatuses,
an optical apparatus corresponding to the photoelectric conversion apparatus,
a control apparatus configured to control the photoelectric conversion apparatus,
a processing apparatus configured to process a signal output from the photoelectric conversion apparatus,
a display apparatus configured to display information acquired from the photoelectric conversion apparatus,
a storage apparatus configured to store the information acquired from the photoelectric conversion apparatus, and
a mechanical apparatus configured to operate based on the information acquired from the photoelectric conversion apparatus.

* * * * *